US007012344B2

(12) United States Patent
Lin et al.

(10) Patent No.: US 7,012,344 B2
(45) Date of Patent: Mar. 14, 2006

(54) SWITCH CONTROL CIRCUIT OF AUTO LASER POWER CONTROL CIRCUIT

(75) Inventors: Jyhfong Lin, Taipei (TW); Cheng Kuo Yang, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 782 days.

(21) Appl. No.: 10/064,139

(22) Filed: Jun. 13, 2002

(65) Prior Publication Data

US 2003/0034694 A1 Feb. 20, 2003

(30) Foreign Application Priority Data

Aug. 15, 2001 (TW) .............................. 90119975 A

(51) Int. Cl.
*H02J 1/10* (2006.01)

(52) U.S. Cl. ........................................ 307/52; 307/112

(58) Field of Classification Search .................. 307/43, 307/52, 112

See application file for complete search history.

(56) References Cited

U.S. PATENT DOCUMENTS 6,798,797 B1 * 9/2004 Mangano et al. ........ 372/29.01

* cited by examiner

*Primary Examiner*—Robert L. DeBeradinis
(74) *Attorney, Agent, or Firm*—Jiang Chyun IP Office

(57) ABSTRACT

A switch control circuit of an auto laser power control circuit is disclosed. The auto laser power control circuit has a feedback circuit and a switch control circuit. The switch control circuit has a first electronic switch, a second electronic switch, a third electronic switch, a fourth electronic switch, and a resistor. When a first control signal is enabled, the first electronic switch and the third electronic switch conduct and the second electronic switch and the fourth electronic switch are turned off. The signal of the feedback amplifying circuit is received by the driving circuit for driving a laser diode. When the first control signal is disabled, the second electronic switch and the fourth electronic switch conduct while the first and the third electronic switches are turned off. Via the voltage formed across the resistor in the driving circuit, the driving circuit is disabled, and the laser diode is completely turned off.

12 Claims, 3 Drawing Sheets

SWITCH CONTROL CIRCUIT OF AUTO LASER POWER CONTROL CIRCUIT

CROSS REFERENCE TO RELATED APPLICATIONS

This application claims the priority benefit of Taiwan application serial no. 90119975, filed on Aug. 15, 2002.

BACKGROUND OF INVENTION

1. Field of the Invention

The invention relates in general to a control circuit of a laser diode, and more particularly, to an auto laser power control circuit and a switch control circuit.

2. Description of the Related Art

Currently, the laser diode driving circuit in an optical storage drive (for example, CD-ROM drive and the like) uses a switch control circuit in an auto laser power control to activate (enable) or cut off (disable) the driving circuit of the laser diode, that is, to turn on or off the laser diode. FIG. 1 shows a conventional switch control circuit in an auto laser power circuit for a laser diode. The laser diode 141 is photo-coupled to a sensor diode 111. That is, the sensor diode 111 converts the light intensity emitted by the light emitting diode 141 into an electrical signal. A close loop control is performed by the feedback amplifying circuit for power control. Under certain circumstances, the power supply VDD1 of the conventional auto laser power control circuit 303 in a chip and the power supply VDD2 of the laser diode driving circuit 304 on a print circuit board (PCB) are both 5V. When the control signal LDEN is high, the P-type transistor 161 does not conduct. A bias circuit is formed by the power supply VDD5 of the laser diode driving circuit 304. The transistor 171 thus turns on and a current flows through the inductor 131 to enable the laser diode 141 to emit a laser. When the control signal LDEN is low, the transistor 161 conducts. The voltage level at the node Y1 is almost the same as the power supply VDD5 and the bias circuit is not formed. Therefore, the transistor 171 is cut off and no current flows from the collector terminal thereof. The laser diode 141 cannot emit a laser.

As the operation speed in circuit becomes higher, and the power consumption is required to be lower, the required power supply is gradually reduced. Alternately, as the chip fabrication process is minimized, a smaller power supply on a chip is also required. Therefore, the required power supply of the auto laser power control circuit is also reduced. For example, the required power supply of the auto laser power control circuit is reduced from 5V to 3.3V. When the control signal LDEN is high, the whole circuit operates without problem. However, when the LDEN is low, a voltage difference is formed between the voltage level at the node Y1 (3.3V) and the power supply VDD5 (5V) of the laser diode driving circuit 304. Meanwhile, the current supplied to the laser diode 141 is ten or more mA (supposing that the PNP type transistor 171 of the laser diode circuit 304 has a current gain of 250, so that the operation current flowing through the laser diode 141 is 14.4325 mA). The operation current makes the laser diode shut off incompletely such that the laser diode possesses the characteristics of an LED. Thus, the lifetime of the laser diode 141 is shortened due to such incomplete turn-offs.

SUMMARY OF INVENTION

The invention provides an auto laser power control circuit and a switch control circuit thereof. Even if the automatic power control circuit has a power supply lower than that of a driving circuit, the laser diode can be turned off completely to extend its lifetime.

The invention provides an auto laser power control circuit to receive a light intensity feedback signal and a photo-coupling signal of a photo-sensing circuit to control a driving circuit, so as to drive the laser diode. The auto laser power control circuit comprises at least a feedback amplifying circuit and a switch control circuit. The feedback amplifying circuit is coupled to the photo-sensing circuit to receive the photo-coupling signal. According to the photo-coupling signal, the feedback amplifying circuit correctly drives the laser diode to emit laser beam. The feedback amplifying also receives the above light intensity feedback signal to adjust the power of the light emitted from the laser diode. The switch control circuit is coupled to a first power supply, the driving circuit and the feedback amplifying circuit to receive the control of a first control signal that enables or disables the driving circuit. When the first control signal is disabled, the switch control circuit disconnects the feedback amplifying circuit and the driving circuit and an equivalent damping is provided. The first power supply is connected to the driving circuit via the equivalent damping. Thus, the driving circuit does not provide current to the laser diode.

The switch control circuit provided by the invention is applied to the auto laser power control circuit of a laser diode driving system. The switch control circuit is coupled to the driving circuit and the feedback amplifying circuit. The switch control circuit comprises a first electronic switch, a second electronic switch, a third electronic switch, a fourth electronic switch and a resistor. Each of the above electronic switches has a first terminal, a second terminal and a control terminal. The first terminal of the first electronic switch is coupled to the feedback amplifying circuit and the first terminal of the second electronic switch is coupled to the first power supply. The second terminal of the third electronic switch is coupled to the driving circuit. The second terminals of the first and second electronic switches, and the first terminals of the third and fourth electronic switches are coupled together. The resistor has a first terminal and a second terminal. The first terminal of the resistor is coupled to the second terminal to the fourth electronic switch. The second terminal of the resistor is coupled to the second terminal of the third electronic switch.

The control terminals of the first, second, third and fourth electronic switches are coupled to a first control signal. When the first control signal is enabled, the first electronic switch and the third electronic switch conduct, while the second and fourth electronic switches are turned off. The signal of the feedback amplifying circuit can thus be received by the driving circuit. When the first control signal is disabled, the first electronic switch and the third electronic switch are turned off, while the second and fourth electronic switches are conducted. The first voltage is connected to the driving circuit via the resistor, so that no current is supplied to the laser diode via the driving circuit.

In one embodiment of the invention, the second electronic switch and the third electronic switch are for example, a PMOS transistor and an NMOS transistor. In addition, the first and fourth electronic switches include a first and second transmission gates. The first transmission gate and the second transmission gate further receive a second control signal that is inverted to the first control signal. When the first control signal is high, the first transmission gate and the second transistor conduct, while the first transistor and the second transmission gate do not conduct. In contrast, when the first control signal is low, the first transistor and the second transmission gates conduct, while the first transmission gate and the second transistor do not conduct.

According to the above, the invention uses four electronic switches and a resistor to construct a switch control circuit of an auto laser power control circuit. By the voltage across the resistor in the driving circuit, the driving circuit is disabled, so that the laser diode is completely turned off. That is, the invention allows the laser diode to be turned off completely under the condition that the auto laser power control circuit has a power supply different from that of the driving circuit. As a result, the laser diode has a longer lifetime.

Both the foregoing general description and the following detailed description are exemplary and explanatory only and are not restrictive of the invention, as claimed.

DETAILED DESCRIPTION

Figure 1:
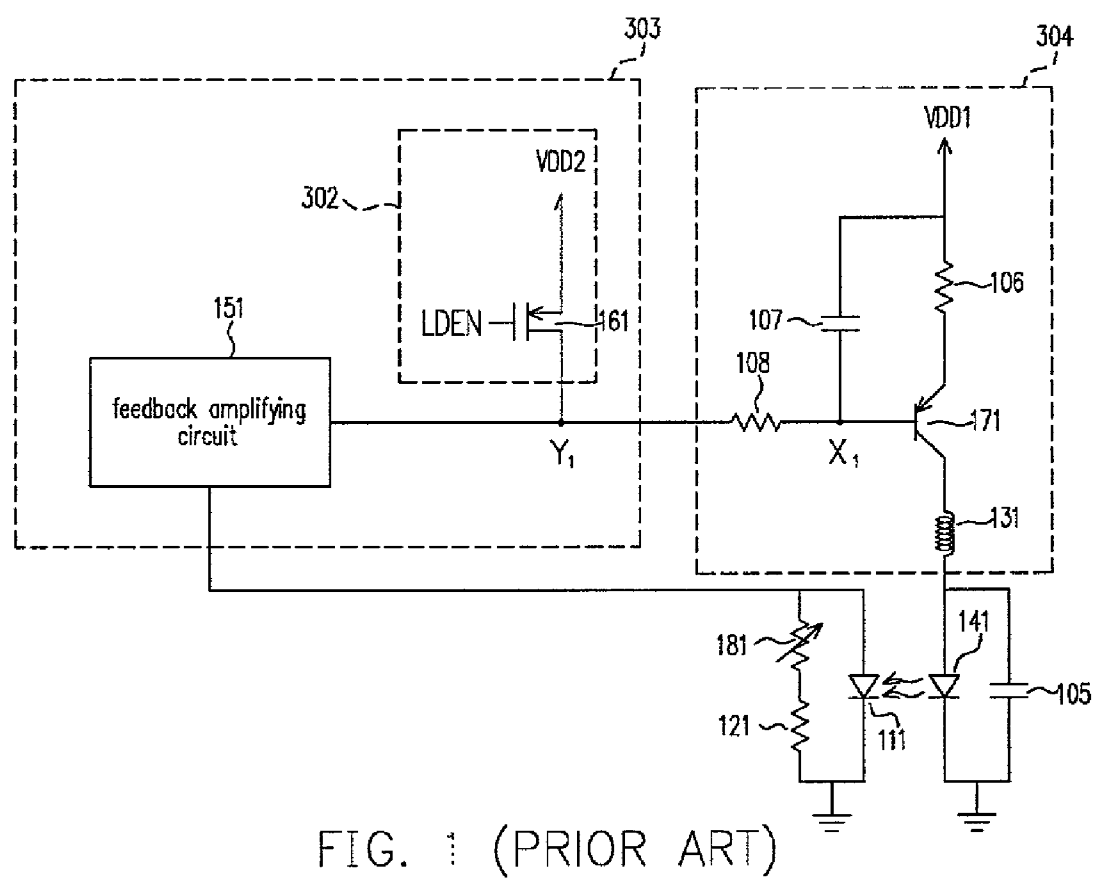
FIG. 1 shows the switch control circuit in an auto laser power circuit for a laser diode in an optical storage device.
Figure 2:
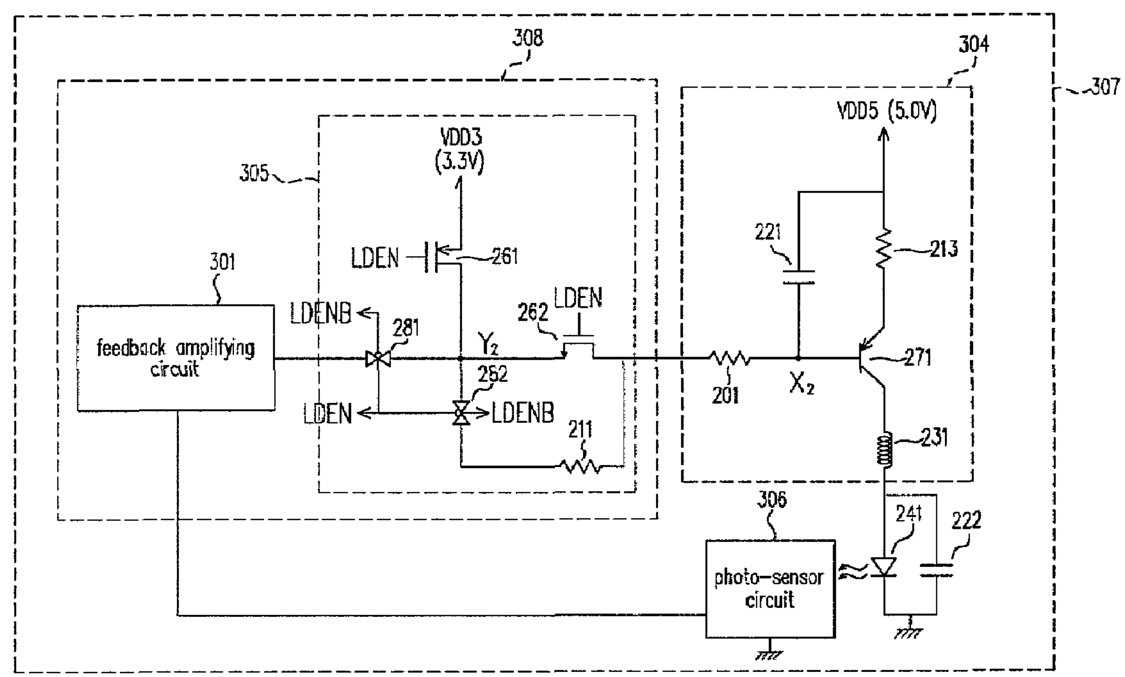
FIG. 2 shows a laser diode driving system applied in an optical storage device according to the invention.

FIG. 2 shows the laser diode-driving system applied in an optical storage device (for example, a CD-ROM drive and the like) according to the invention.

The auto laser power control circuit 308 comprises a feedback amplifying circuit 301 and a switch control circuit 305. The feedback amplifying circuit 301 is coupled to the switch control circuit 305 and a photo-sensor circuit 306. The switch control circuit 305 is further coupled to a driving circuit 304. The above circuits and the laser diode 241 construct the whole laser diode driving system 307.

In this embodiment, a first power source VDD3, for example, 3.3V, is applied to the auto laser power control circuit 308 that receives a first control signal LDEN and a second control signal LDENB for switch control. The second control signal LDENB is inverted to the first control signal LDEN. A second power source VDD 5, for example, 5.0V, is applied to the driving circuit 304.

When the first control signal LDEN is high (that is, when the second control signal LDENB is low), the signal of the feedback amplifying circuit 301 is received by the driving circuit. That is, the auto laser power control circuit 308 enables the driving circuit 304, so as to enable the laser diode.

When the first control signal LDEN is low (that is, when the second control signal LDENB is high), the switch control circuit 305 provides an equivalent resistor (or an equivalent damping) with high impedance to disable the driving circuit 304. The laser diode 141 is then turned off completely.

The switch control circuit 305 of the auto laser power control circuit 308 comprises 4 electronic switches 281, 282, 261, 261 and a resistor 211. The electronic switch 261 adapts a PMOS transistor, and the electronic switch 262 adapts an NMOS transistor. The electronic switches 281, 282 each adapt a transmission gate with two control terminals.

The switch control circuit 305 is coupled to the feedback amplifying circuit 301 and the driving circuit 304. The power supply VDD3 of the switch control circuit, that is, the power supply of the whole auto laser power control circuit 308, is 3.3V. The power supply VDD5 of the driving circuit is 5V.

In addition, the transmission gates 281, 282 of the switch control circuit receive two control signals (LDEN and LDENB) to control the conductance (on or off state) thereof.

Figure 3A:
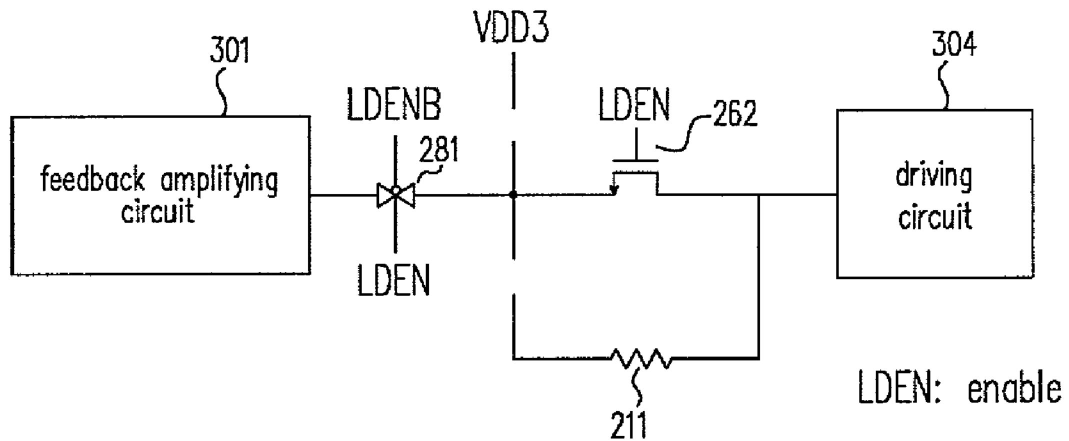
FIG. 3A shows an equivalent circuit of the switch control circuit in FIG. 2 when the LDEN is enabled.

Referring to FIGS. 2 and 3A. FIG. 3A illustrates an equivalent circuit of the switch control circuit in FIG. 2 when the LDEN is enabled. When the first control signal LDEN is high (that is, the second control signal LDENB is low), P-channel MOS transistor 261 and the transmission gate 282 are turned off, and the transmission gate 281 and the N-channel MOS transistor 262 conduct. Meanwhile, the signal of the feedback amplifying circuit is input to the driving circuit to form a potential at X2 node. A bias is established between the node X2 and the second power supply VDD5 of the driving circuit. The bias is enough to turn on the BJT transistor 171, so that the laser diode 141 has the characteristic of laser emitting.

Figure 3B:
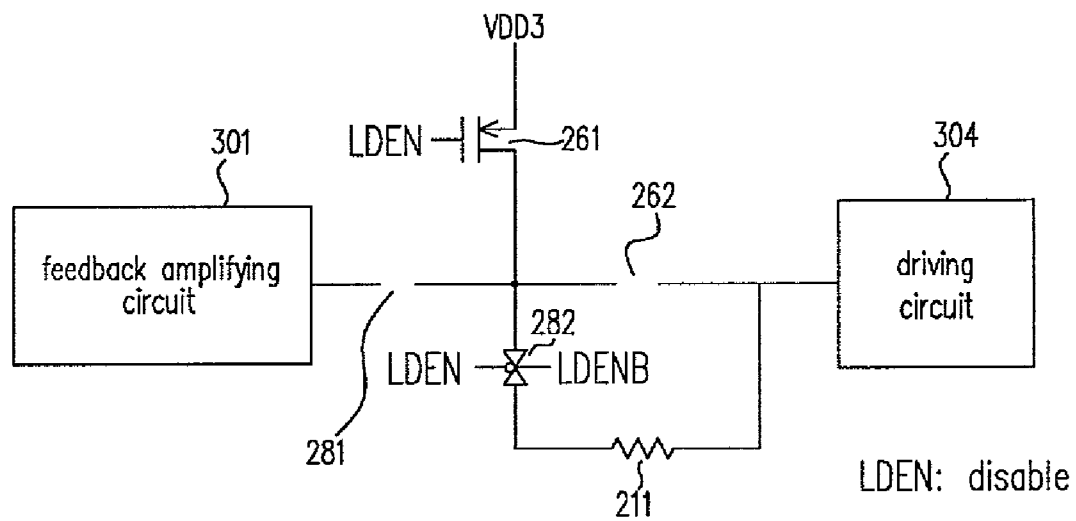
FIG. 3B shows an equivalent circuit of the switch control circuit in FIG. 2 when the LDEN is disabled.

Referring to FIGS. 2 and 3B. FIG. 3B illustrates an equivalent circuit of the switch control circuit in FIG. 2 when the LDEN is disabled. When the first control signal LDEN low (that is, the second control signal LDENB is high), P-channel MOS transistor 261 and the transmission gate 282 conduct, and the transmission gate 281 and the N-channel MOS transistor 262 are turned off. Meanwhile, the node Y2 has a voltage level almost the same as the power supply VDD3 (3.3V). According to the voltage difference between the power supply VDD5 of the driving circuit 304 and the power supply VDD3 of the switch control circuit 305, a proper resistor is decided. Using voltage division, a voltage level at the node X2 has to be close to the power supply VDD5 of the driving circuit 304. When the voltage levels at the emitter and the base of the P-type BJT transistor 271 are almost the same, the P-type BJT transistor 271 is in a cutoff state. Thus, no current flows out of the collector of the P-type BJT transistor 271, so that the laser diode 241 is turned off.

The value of resistor 211 is determined according to the relationship between the power supply of the auto laser power control circuit 308 and the power supply of the driving circuit 304. According to voltage division, the voltage level at the node X2 had better to be close to the power supply VDD5 of the driving circuit 304 and not affected by the potential at the node Y2. Therefore, when the power supply of the laser diode control circuit 302 is more close to the power supply of the laser diode driving circuit 304, the resistance of the resistor 211 is reduced, and vice versa. For example, when the power supply of the laser diode power control circuit 303 is 3.3V, the resistance of the resistor 211 is about 1 MOhm. Accordingly, the embodiment uses two transmission gates, two transistors and one resistor construct the switch control circuit of the automatic laser power control circuit. When the power supply of the auto laser power control circuit and the driving circuit are different, the laser diode can be turned off completely to lengthen the lifetime of the laser diode.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A switch control circuit, applied to an auto laser power control circuit of a laser diode driving system, the switch control circuit being coupled to a driving circuit and a feedback amplifying circuit, the switch control circuit comprising:

a first electronic switch, having a first terminal coupled to the feedback amplifying circuit, a second terminal and a control terminal;

a second electronic switch, having a first terminal coupled to a first power supply, a second terminal and a control terminal;

a third electronic switch, having a first terminal, a second terminal coupled to the driving circuit and a control terminal;

a fourth electronic switch, having a first terminal, a second terminal and a control terminal, wherein the second terminal of the first electronic switch, the second terminal of the second electronic switch, the first terminal of the third electronic switch and the first terminal of the fourth electronic switch are coupled together; and a resistor, having a first terminal coupled to the second terminal of the fourth electronic switch and a second terminal coupled to the second terminal of the third electronic switch;

wherein the control terminals of the first, second, third and fourth electronic switches receive a first control signal, and when the first control signal is enabled, the first and third electronic switches conduct and the second and fourth electronic switches are turned off, and when the first control signal is disabled, the first and third electronic switches are turned off and the second and fourth electronic switches conduct.

2. The switch control circuit according to claim 1, wherein the second electronic switch includes a first transistor, the third electronic switch includes a second transistor, and the first transistor and the second transistor are different types of transistor.

3. The switch control circuit according to claim 2, wherein the first transistor includes a PMOS transistor.

4. The switch control circuit according to claim 2, wherein the second transistor includes an NMOS transistor.

5. The switch control circuit according to claim 2, wherein the first electronic switch includes a first transmission gate, the fourth electronic switch includes a second transmission gate, and the first and second transmission gates receive a second control signal inverted to the first control signal.

6. The switch control circuit according to claim 5, wherein when the first control signal is high, the first transmission gate and the second transistor conduct while the first transistor and the second transmission gate do not conduct, and when the first control signal is low, the first transistor and the second transmission gate conduct and the first transmission gate and the second transistor do not conduct.

7. The switch control circuit according to claim 1, wherein the driving circuit is coupled to a second power supply, the first voltage is 3.3V, the second voltage is 5V, and the resistor is 1 MOhm.

8. The switch control circuit according to claim 1, wherein the driving circuit is coupled to a second power supply lower than the first power supply.

9. A switch control circuit, applied in an auto laser power control circuit of a laser diode driver, the switch control circuit coupled to a driving circuit and a feedback amplifying circuit, switch control circuit comprising:

a switch device, receiving a first control signal, the switch device coupled to a first power supply, the driving circuit and the feedback amplifying circuit;

a damping, having a first terminal coupled to the switch device and a second terminal coupled to a coupling node between the driving circuit and the switch device;

wherein the first control signal decided whether the first power supply is coupled to the damping and whether the feedback amplifying circuit is coupled to the driving circuit.

10. The switch control circuit according to claim 8, wherein the switch device comprises:

a first switch, coupled between the driving circuit and the feedback amplifying circuit, the conduction of the first switch being related to the first control signal; and a second switch, coupled between the first power supply and the first terminal of the damping, the conduction of the second switch being related to the first control signal.

11. The switch control circuit according to claim 9, wherein the switch device comprises:

a first electronic switch, having a first terminal coupled to the feedback amplifying circuit, a second terminal and a control terminal;

a second electronic switch, having a first terminal coupled to the first power supply, a second terminal and a control terminal;

a third electronic switch, having a first terminal, a second terminal coupled to the driving circuit and a control terminal; and a fourth electronic switch, having a first terminal, a second terminal and a control terminal, wherein the second terminal of the first electronic switch, the second terminal of the second electronic switch, the first terminal of the third electronic switch and the first terminal of the fourth electronic switch are coupled together;

wherein the control terminals of the first, second, third and fourth electronic switches receive the first control signal, and when the first control signal is enabled, the first and third electronic switches conduct and the second and fourth electronic switches are turned off, and when the first control signal is disabled, the first and third electronic switches are turned off and the second and fourth electronic switches conduct.

12. The switch control circuit according to claim 11, wherein the first electronic switch includes a first transmission gate, the fourth electronic switch includes a second transmission gate, and the first and second transmission gates receive a second control signal inverted to the first control signal.

* * * * *